US011648640B2

(12) United States Patent
Miyazaki (10) Patent No.: US 11,648,640 B2
(45) Date of Patent: May 16, 2023

(54) METHOD OF DOUBLE-SIDE POLISHING WAFER (71) Applicant: SUMCO CORPORATION, Tokyo (JP)

(72) Inventor: Yuji Miyazaki, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 372 days.

(21) Appl. No.: 16/764,464

(22) PCT Filed: Oct. 23, 2018

(86) PCT No.: PCT/JP2018/039362
§ 371 (c)(1),
(2) Date: May 15, 2020

(87) PCT Pub. No.: WO2019/130764
PCT Pub. Date: Jul. 4, 2019

(65) Prior Publication Data
US 2020/0353585 A1 Nov. 12, 2020

(30) Foreign Application Priority Data
Dec. 25, 2017 (JP) .............................. JP2017-248298

(51) Int. Cl.
B24B 37/08 (2012.01)
B24B 37/04 (2012.01)

(52) U.S. Cl.
CPC ............ B24B 37/08 (2013.01); B24B 37/042 (2013.01)

(58) Field of Classification Search
None
See application file for complete search history.

(56) References Cited

U.S. PATENT DOCUMENTS

2008/0227371 A1 9/2008 Onishi et al.
2012/0329373 A1 12/2012 Ueno et al.
(Continued)

FOREIGN PATENT DOCUMENTS

JP 2008-227393 A 9/2008
JP 2011-134823 A 7/2011
(Continued)

OTHER PUBLICATIONS

ISR for PCT/JP2018/039362, dated Nov. 20, 2018.
IPRP for PCT/JP2018/039362 dated Jun. 30, 2020 (w/ translation).

*Primary Examiner* — Long Pham
(74) *Attorney, Agent, or Firm* — Greenblum & Bernstein, P.L.C.

(57) ABSTRACT

Provided is a method of double-side polishing a wafer by which variations of the GBIR values of polished wafers between batches can be reduced. In the method of double-side polishing a wafer, a current batch includes measuring the center thickness of the wafer before polishing (S100); setting a target GBIR value within a predetermined range (S110); calculating a polishing time of the current batch based on Formula (1) (S120); and polishing both surfaces of the wafer for the calculated polishing time (S130).

Polishing time of current batch=polishing time of previous batch+$A_1$×(center thickness of wafer before polishing in previous batch−center thickness of wafer before polishing in current batch)+$A_2$×(GBIR value of wafer after polishing in previous batch−target GBIR value)+$A_3$ (1), where $A_1$, $A_2$, and $A_3$ are predetermined coefficients.

3 Claims, 7 Drawing Sheets (56) References Cited

U.S. PATENT DOCUMENTS

2014/0256227 A1  9/2014  Aoki et al.
2015/0165585 A1  6/2015  Ogata et al.

FOREIGN PATENT DOCUMENTS

| JP | 2015-123545 A | 7/2015 |
| WO | WO 2013/069198 A1 | 5/2013 |
| WO | WO 2014/002467 A1 | 1/2014 |

METHOD OF DOUBLE-SIDE POLISHING WAFER

TECHNICAL FIELD

This disclosure relates to a method of double-side polishing wafers.

BACKGROUND

In the production of wafers used in a semiconductor device, in order to obtain a wafer having high flatness, double-side polishing is performed in which a wafer is sandwiched between upper and lower plates having polishing pads and the front and back surfaces of the wafer are simultaneously polished. The shape required of a wafer varies depending on the application, and it is necessary that a target value of the polishing amount of the wafer be set depending on the application and the polishing amount be controlled accurately. In particular, since the flatness of wafers is one of important factors in improving the integrity of large-scale integrated circuits, there is a demand for accurately controlling the shape of wafers.

WO 2014-002467 A (PTL 1) describes a technique of controlling the amount of polishing removal of a wafer by the following method. That is, when double-side polishing starts, the distance between the center of an upper plate and a lower plate and the center of a wafer periodically changes with the rotation of a carrier plate. The torque of the drive mechanism of the carrier plate, the upper plate, or the lower plate includes a torque component that changes in synchronization with the periodic change in that distance, and the fluctuation of the torque component is reduced as the polishing proceeds. To address this, at least one of the torques of the drive mechanism of the carrier plate, the upper plate, and the lower plate is measured, and the amount of polishing removal of the wafer is controlled based on the fluctuation of the torque component due to the periodic change in the distance described above.

CITATION LIST

Patent Literature

PTL 1: WO 2014-002467 A

SUMMARY

Technical Problem

In PTL 1, the amount of polishing removal of a wafer in a certain batch is controlled based on the fluctuation of the torque component of the drive mechanism etc. However, the studies made by the inventors of this disclosure revealed that in the method of PTL 1, the GBIR values of wafers having been polished varied between batches due to the wear of the carrier plate and polishing pads with increasing number of batch processes, or change in the concentration of polishing slurry due to mixing of rinse water or the like, and the GBIR values might be out of the wafer specifications.

In view of the above problem, it could be helpful to provide a method of double-side polishing a wafer by which variations of the GBIR values of polished wafers between batches can be reduced.

Solution to Problem

The inventors made intensive studies to solve the above problem and found that variations of the GBIR values of polished wafers between batches could be controlled by controlling the polishing time based on the Formula (1) defined below instead of the polishing amount. This led to the completion of this disclosure.

Polishing time of current batch=polishing time of previous batch+$A_1$×(center thickness of wafer before polishing in previous batch−center thickness of wafer before polishing in current batch)+$A_2$×(GBIR value of wafer after polishing in previous batch−target GBIR value)+$A_3$    (1), where $A_1$, $A_2$, and $A_3$ are predetermined coefficients.

This disclosure is based on the above findings, and we propose the following features.

[1] A method of double-side polishing a wafer using a batch processing double-polishing apparatus for wafer, including rotating platens having an upper plate and a lower plate; a sun gear provided at a center portion of the rotating platens; an internal gear provided on a peripheral portion of the rotating platens; and a carrier plate having one or more retainer openings that is provided between the upper plate and the lower plate, in which apparatus a polishing pad is attached to each of an undersurface of the upper plate and a top surface of the lower plate, wherein a current batch comprises:

a step of measuring a center thickness of the wafer before polishing;

a step of setting a target GBIR value within a predetermined range;

a step of calculating a polishing time of the current batch based on Formula (1) below; and a step of while supplying a polishing slurry to the polishing pads, relatively rotating the rotating platens and the carrier plate so that both surfaces of the wafer are polished for the calculated polishing time of the current batch.

Polishing time of current batch=polishing time of previous batch+$A_1$×(center thickness of wafer before polishing in previous batch−center thickness of wafer before polishing in current batch)+$A_2$×(GBIR value of wafer after polishing in previous batch−target GBIR value)+$A_3$    (1), where $A_1$, $A_2$, and $A_3$ are predetermined coefficients.

[2] The method of double-side polishing a wafer, according to [1] above, wherein in the current batch, the target GBIR value is set within a predetermined range so that a target ESFQD value calculated by Formula (2) below is within a predetermined range.

Target ESFQD value=$B_1$×target GBIR value+$B_2$×ESFQD value after polishing in previous batch+$B_3$    (2), where $B_1$, $B_2$, and $B_3$ are predetermined coefficients.

[3] The method of double-side polishing a wafer, according to [1] above, wherein in the current batch, the target GBIR value is set within a predetermined range so that a target ESFQR value calculated by Formula (3) below is within a predetermined range.

Target ESFQR value=$C_1$×target GBIR value+$C_2$×ESFQR value after polishing in previous batch+$C_3$    (3), where $C_1$, $C_2$, and $C_3$ are predetermined coefficients.

[4] A method of double-side polishing a wafer using a batch processing wafer double-polishing apparatus for wafer, including rotating platens having an upper plate and a lower plate; a sun gear provided at a center portion of the rotating platens; an internal gear provided on a peripheral portion of the rotating platens; and a carrier plate having one or more retainer openings that is provided between the upper plate and the lower plate, in which apparatus a polishing pad is attached to each of an undersurface of the upper plate and a top surface of the lower plate, wherein in a case where first to Mth members, where M is a natural number equal to or more than 2, representing a total number of members to be replaced, used in the double-side polishing method are replaced, when the current batch is an $n_m$th batch after the replacement of an mth member, where m is an index for identifying a member to be replaced which can be one of all natural numbers satisfying $1 \leq m \leq M$, where $n_m$ is a natural number for each m, (I) when any one of $n_1$ to $n_M$ is 1,
the current batch comprises:
a step of measuring a center thickness of the wafer before polishing;
a step of setting a target wafer center thickness within a predetermined range; and
a step of calculating the first polishing time based on Formula (4) below as a polishing time of the current batch, and (II) when all $n_1$ to $n_M$ are 2 or more,
(i) when all $n_1$ to $n_M$ satisfy $n_m \geq k_m$, where $k_m$ is a natural number equal to or more than 2 for each m depending on the mth member to be replaced,
the current batch comprises:
a step of measuring a center thickness of the wafer before polishing;
a step of setting a target GBIR value within a predetermined range; and
a step of calculating the second polishing time based on Formula (5) below as a polishing time of the current batch, and (ii) when any one of $n_1$ to $n_M$ does not satisfy $n_m \geq k_m$,
the current batch comprises:
a step of measuring a center thickness of the wafer before polishing;
a step of setting a target center thickness and a target GBIR value of the wafer within a predetermined range;
a step of calculating a first polishing time based on Formula (4) below and then calculating a first determination amount based on Formula (6) below;
a step of calculating a second polishing time based on Formula (5) below and then calculating a second determination amount based on Formula (7) below; and
a step of determining the second polishing as a polishing time of the current batch when the second determination amount≥0,
otherwise determining, in a case where the second determination amount<0, the first polishing time as a polishing time of the current batch when the first determination amount≥0, and a polishing time of an immediately preceding batch as a polishing time of the current batch when the first determination amount<0, wherein after the above steps, while a polishing slurry is supplied to the polishing pads, the rotating platens and the carrier plate are relatively rotated so that both surfaces of the wafer are polished for the polishing time of the current batch.

First polishing time=(center thickness of wafer before polishing in current batch−target center thickness of wafer)/predetermined polishing rate  (4), Second polishing time=polishing time of previous batch+$A_1$×(center thickness of wafer before polishing in previous batch−center thickness of wafer before polishing in current batch)+$A_2$×(GBIR value of wafer after polishing in previous batch−target GBIR value)+$A_3$  (5), First determination amount=(target GBIR value−GBIR value of wafer after polishing in previous batch)×(first polishing time−polishing time of previous batch)  (6), and Second determination amount=(target GBIR value−GBIR value of wafer after polishing in previous batch)×(second polishing time−polishing time of previous batch)  (7), where $A_1$, $A_2$, and $A_3$ are predetermined coefficients.

[5] The method of double-side polishing a wafer, according to [4] above,
wherein the predetermined polishing rate in Formula (4) above is a total polishing rate obtained by
determining a reference polishing rate by averaging, of actual values of polishing rates of wafers having a center thickness before polishing and a target center thickness the same as a center thickness before polishing and a target center thickness of the wafer, actual values of polishing rates in a batch that is not affected by the replacement of any of the first to Mth members;
determining, when $n_m \geq k_m$ holds, an mth increment of polishing rate for each m as 0, and when $n_m < k_m$ holds, an mth increment of polishing rate for each m as an average of differences obtained by subtracting, of the actual values of the polishing rates of the wafers having a center thickness before polishing and a target center thickness the same as the center thickness before polishing and the target center thickness of the wafer, actual values of polishing rates in a batch that is not affected by the replacement of any of the first to Mth members from actual values of polishing rates in the $n_m$th batch after the replacement of the mth member, which $n_m$th batch is not affected by replacement of any member other than the mth member; and
adding the first to Mth increments of polishing rate to the reference polishing rate.

[6] The method of double-side polishing a wafer, according to [4] or [5] above, wherein the members are two or more members selected from the carrier plate, the polishing pads, and the polishing slurry.

[7] A method of double-side polishing a wafer using a batch processing wafer double-polishing apparatus for wafer, including rotating platens having an upper plate and a lower plate; a sun gear provided at a center portion of the rotating platens; an internal gear provided on a peripheral portion of the rotating platens; and a carrier plate having one or more retainer openings that is provided between the upper plate and the lower plate, in which apparatus a polishing pad is attached to each of an undersurface of the upper plate and a top surface of the lower plate, wherein in a case where one member used in this method of double-side polishing a wafer is replaced and a current batch is an nth batch, where n is a natural number, after the replacement of the member,
(I) when n=1 is satisfied,
the current batch comprises:
a step of measuring a center thickness of the wafer before polishing;
a step of setting a target wafer center thickness within a predetermined range; and a step of calculating a first polishing time based on Formula (8) below as a polishing time of the current batch, and
(II) when n≥2 is satisfied,
(i) in a case where n≥k, where k is a natural number equal to or more than 2 determined depending on the member to be replaced, is satisfied,
the current batch comprises:
a step of measuring a center thickness of the wafer before polishing;
a step of setting a target GBIR value within a predetermined range; and
a step of calculating a second polishing time based on Formula (9) below as a polishing time of the current batch, and
(ii) in a case where n<k is satisfied,
the current batch comprises:
a step of measuring a center thickness of the wafer before polishing;
a step of setting a target center thickness and a target GBIR value of the wafer within a predetermined range;
a step of calculating a first polishing time based on Formula (8) below and then calculating a first determination amount based on. Formula (10) below; and
a step of calculating a second polishing time based on Formula (9) below and then calculating a second determination amount based on Formula (11) below; and
a step of determining the second polishing as a polishing time of the current batch when the second determination amount≥0,
otherwise determining, in a case where the second determination amount<0, the first polishing time as a polishing time of the current batch when the first determination amount≥0, and a polishing time of a previous batch as a polishing time of the current batch when the first determination amount<0,
wherein after the above steps, while a polishing slurry is supplied to the polishing pads, the rotating platens and the carrier plate are relatively rotated so that both surfaces of the wafer are polished for the polishing time of the current batch.

First polishing time=(center thickness of wafer before polishing in current batch−target center thickness of wafer)/predetermined polishing rate    (8), Second polishing time=polishing time of previous batch+$A_1$×(center thickness of wafer before polishing in previous batch−center thickness of wafer before polishing in current batch)+$A_2$×(GBIR value of wafer after polishing in previous batch−target GBIR value)+$A_3$    (9), First determination amount=(target GBIR value−GBIR value of wafer after polishing in previous batch)×(first polishing time−polishing time of previous batch)    (10), and Second determination amount=(target GBIR value−GBIR value of wafer after polishing in previous batch)×(second polishing time−polishing time of previous batch)    (11), where $A_1$, $A_2$, and $A_3$ are predetermined coefficients.

[8] The method of double-side polishing a wafer, according to [7] above, wherein the predetermined polishing rate in Formula (8) is an average of actual values of polishing rates in an nth batch after the replacement of the member.

[9] The method of double-side polishing a wafer, according to [7] or [8] above, wherein the member is one member selected from the carrier plate, the polishing pads, and the polishing slurry.

Advantageous Effect

According to the disclosed method of double-side polishing a wafer, variation of the GBIR values of polished wafers between batches can be reduced.

BRIEF DESCRIPTION OF THE DRAWINGS

In the accompanying drawings.

DETAILED DESCRIPTION

First Embodiment

Figure 1:
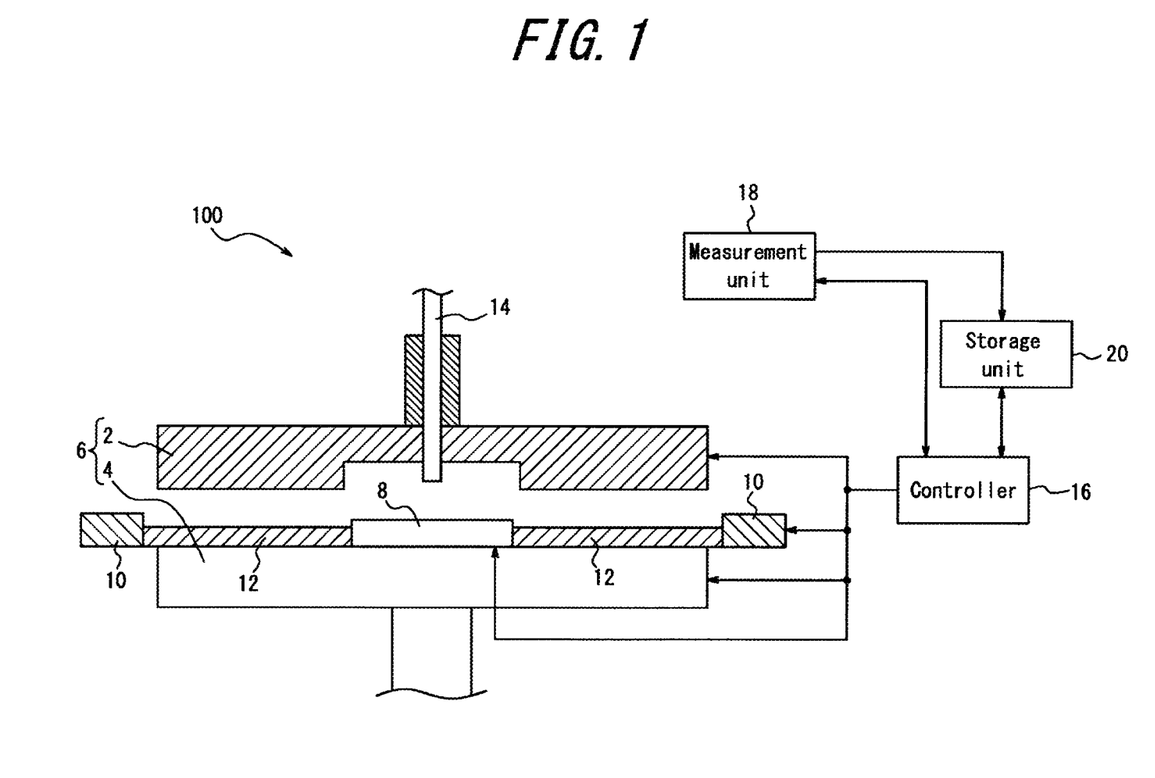
FIG. 1 is a schematic view illustrating a double-side polishing apparatus 100 for wafer which can be used in first to fifth embodiments of this disclosure.
Figure 2:
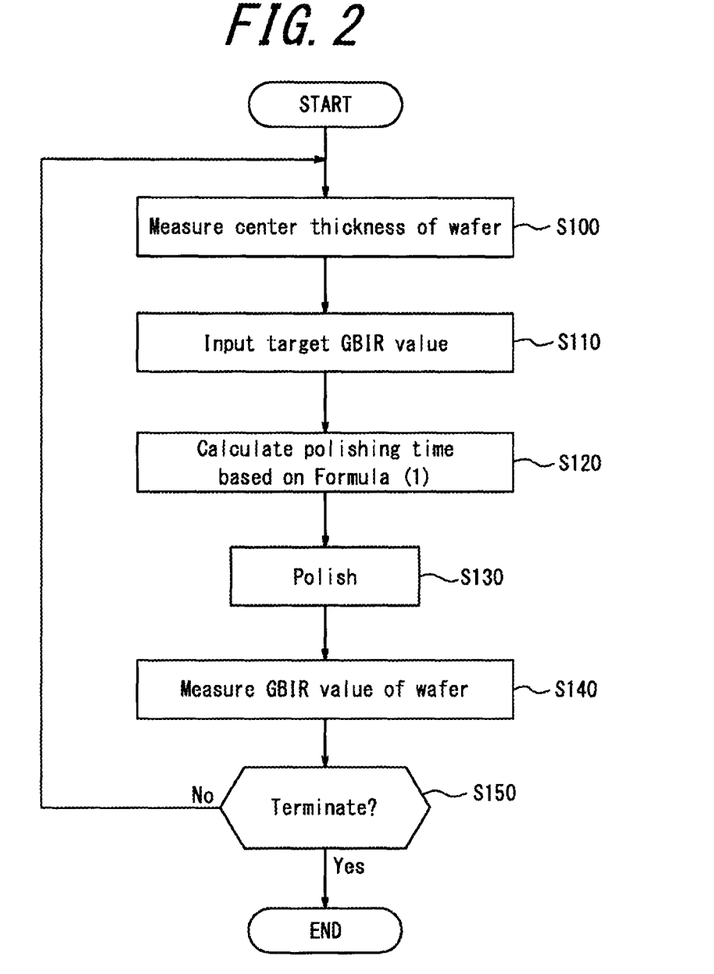
FIG. 2 is a flowchart illustrating a method of double-side polishing wafers according to the first embodiment of this disclosure.

With reference to FIGS. 1 and 2, the first embodiment of this disclosure will now be described.

With reference to FIG. 1, the double-side polishing apparatus 100 which can be used in the first embodiment of this disclosure is described. The double-side polishing apparatus 100 includes rotating platens 6 having an upper plate 2 and a lower plate 4; a sun gear 8 provided at a center portion of the rotating platens 6; an internal gear 10 provided on a peripheral portion of the rotating platens 6; and a carrier plate 12 having one or more retainer openings (not shown) for retaining wafers, which is provided between the upper plate 2 and the lower plate 4. Further, a polishing pad (not shown) is attached to each of the undersurface of the upper plate 2 and the top surface of the lower plate 4. In the double-side polishing apparatus 100, a slurry supply system 14 for supplying a polishing slurry is provided at a center portion of the upper plate 2.

Referring to FIG. 1, the double-side polishing apparatus 100 further includes a controller 16, a measurement unit 18, and a storage unit 20. The controller 16 has a control unit controlling the rotation of the upper plate 2, the lower plate 4, the sun gear 8, and the internal gear 10; a calculation unit for calculating the polishing time; and a determination unit for determining polishing conditions etc. The controller 16 can be implemented as a central processing unit (CPU) in a computer. The measurement unit 18 can be implemented using a spectral interference displacement meter, and measures the center thickness and the GBIR value of a wafer. The storage unit 20 stores calculated values of polishing time, measured values of the center thickness of a wafer, measured values of the GBIR value, etc. The storage unit 20 can be implemented using a hard disk, a ROM, or a RAM.

The term "GBIR value" herein means GBIR defined in SEMI M1 and SEMI MF1530.

With reference to FIGS. 1 and 2, an example of a method of double-side polishing wafers that can be performed using this double-side polishing apparatus 100 is descried below.

Referring to FIGS. 1 and 2, when a batch process starts, at least the center thickness of a wafer before being polished is measured using a spectral interference displacement meter as the measurement unit 18 (step S100). Specifically, the spectral interference displacement meter has a first sensor portion (not shown) for examining the front surface of a wafer; a second sensor portion (not shown) for examining the back surface of the wafer, provided to face the first sensor portion; and an arithmetic unit (not shown). The following measurement is performed using this meter. The first sensor portion and the second sensor portion emit light in a broad wavelength range onto the centers of the front and back surfaces of the wafer and receive reflective lights reflected at the centers. After that, the reflective lights received by the sensor portions are analyzed by the arithmetic unit, thereby calculating the center thickness of the wafer. The measured center thickness is sent to the controller 16 to be used in the calculation of the polishing time of the current batch (step S120). Further, the measured center thickness is stored in the storage unit 20 to be also used for the calculation of the polishing time of the next batch in the batch process of the next batch.

Next, a target GBIR value of the wafer is input to the controller 16 via an input device (not shown)(step S110). Here, the term "target GBIR value" is a value that can be set as appropriate depending on the wafer specifications, and can be selected within a range of for example 200 nm or less.

Next, when the current batch is a second or subsequent batch from the start of the batch process, the controller 16 calculates the polishing time of the current batch based on Formula (1) below (step S120).

$$\text{Polishing time of current batch} = \text{polishing time of previous batch} + A_1 \times (\text{center thickness of wafer before polishing in previous batch} - \text{center thickness of wafer before polishing in current batch}) + A_2 \times (\text{GBIR value of wafer after polishing in previous batch} - \text{target GBIR value}) + A_3 \quad (1),$$

The calculated polishing time of the current batch is stored in the storage unit 20 to be also used for the calculation of the polishing time of the next batch in the batch process of the next batch. Here, in this embodiment, "polishing time of previous batch" in Formula (1) above refers to the polishing time calculated in step S120 of the immediately preceding hatch. Further, "center thickness of wafer before polishing in previous batch" refers to the center thickness of the wafer measured in step S100 of the immediately preceding batch. Further, "GBIR value after polishing in previous batch" refers to the GBIR value measured in step S140 (described in detail later) of the immediately preceding batch. These values are stored in the storage unit 20 in the immediately preceding batch. The controller 16 reads these values from the storage unit 20 in step S120 of the current batch. Note that in this disclosure, "previous hatch" in Formula (1) above is required to be a batch preceding the current batch by the same number of batches from the current batch, however, the previous batch is not required to be a batch immediately preceding the current batch. On the other hand, when the current batch is the first batch after the start of the batch process, the polishing time of the current batch is not calculated using Formula (1) above, but alternatively can be set as appropriate using the average of the polishing rates of at least 20 previous batches, and specifically can be set as appropriate so that the average is 0.3 μm/min to 0.7 μm/min.

$A_1$, $A_2$, and $A_3$ in Formula (1) above are coefficients derived in advance by the following method using the actual values found in double-side polishing. The target GBIR value is determined in advance within a predetermined range (for example, 200 nm or less that is a wafer specification), and double-side polishing of wafers is performed so as to meet the target GBIR value. In each batch, the center thicknesses of the wafers before polishing and the GBIR values of the wafers after polishing are measured and these measured values are accumulated as actual values with the actual polishing times. Here, the GBIR value actually measured may be out of the range of the wafer specifications due to change in the wafer shape caused by the wear of the carrier plate and polishing pads, or change in the concentration of the polishing slurry caused by mixing of rinse water etc. Of the accumulated actual values, only the actual values corresponding to the measured GBIR values within the range of the wafer specifications are extracted. Next, using the extracted actual values, multiple regression analysis is performed using the increment time (=polishing time of current batch−polishing time of previous batch) as an objective variable and using the original thickness difference (=center thickness of wafer before polishing in previous batch−center thickness of wafer before polishing in current batch) and the GBIR difference (=GBIR value after polishing in previous batch−target GBIR value) as explanatory variables. Thus, $A_1$, $A_2$, and $A_3$ corresponding to the predetermined target GBIR value are derived. This sequence of operations is repeated by changing the target GBIR value within the predetermined range mentioned above, thus $A_1$, $A_2$, and $A_3$ corresponding to different target GBIR values can be derived. For example, when the target GBIR value of a wafer is selected within a range of 200 nm or less and the unit of the polishing time is s, $A_1$ is 1 to 500 (s/μm), $A_2$ is −10 to 10 (s/nm), and $A_3$ is 0 to 500 (s). The thus derived $A_1$, $A_2$, and $A_3$ are stored in the storage unit 20. When the polishing time according to Formula (1) above is calculated, $A_1$, $A_2$, and $A_3$ corresponding to the target GBIR input in step S110 are read by the controller 16.

Next, referring to FIGS. 1 and 2, after the calculation of the polishing time according to Formula (1) above ends, the controller 16 rotates the upper plate 2, the lower plate 4, the sun gear 8, and the internal gear 10. This initiates double-side polishing of the wafer (step S130). In the double-side polishing, at least one wafer is retained by the carrier plate 12 provided with at least one retainer opening for retaining the wafer; the wafer is sandwiched between the rotating platens 6 consisting of the upper plate 2 and the lower plate 4; while a polishing slurry is supplied to the polishing pads from the slurry supply system 14, the rotating platens 6 and the carrier plate 12 are relatively rotated by the rotation of the sun gear 8 provided at a center portion of the rotating platens 6 and the rotation of the internal gear 10 provided on a peripheral portion of the rotating platens 6. Thus, both surfaces of the wafer are polished for the polishing time calculated using Formula (1). When the controller 16 terminates the rotation of the upper plate 2, the lower plate 4, the sun gear 8, and the internal gear 10, the double-side polishing of the wafer ends.

Next, upon receiving the information of the end of double-side polishing from the controller 16, the spectral interference displacement meter as the measurement unit 18 measures the GBIR value of the wafer after polishing (step S140). The measured GBIR value is stored in the storage unit 20 to be used for the calculation of the polishing time of the next batch in the batch process of the next batch. The measurement of the GBIR value can be performed as follows. The wafer is removed from the carrier plate using a robot (not shown) provided in the double-side polishing apparatus. After that, the first sensor portion and the second sensor portion of the spectral interference displacement meter emit light in a broad wavelength range onto measurement portions of the front and back surfaces of the wafer and receive reflective lights reflected at the measurement portions. After that, the reflective lights received by the sensor portions are analyzed by the arithmetic unit, thereby calculating the thickness of the measurement portions of the wafer. This is repeated by moving the wafer in the diameter direction at 100 µm intervals between the first sensor portion and the second sensor portion using the robot. In this manner, the maximum thickness and the minimum thickness are determined from the measure wafer thicknesses, thereby calculating the GBIR value (=maximum thickness−minimum thickness).

Next, the controller 16 determines whether the batch process is terminated or not (step S150). When the batch process is not terminated, double-side polishing of the next batch starts again from step S100. That is, in this embodiment, the polishing times of the second and subsequent batches are subjected to feedback control using Formula (1) taking into account the GBIR values of the wafers in addition to the center thicknesses of the wafers. Accordingly, variation of the GBIR values of polished wafers between batches can be reduced. When the batch process is determined to be terminated, the batch process ends here.

Second Embodiment

In the second embodiment, the ESFQD values are also considered in calculating the polishing time based on Formula (1) above in the first embodiment. Differences from the first embodiment are described below. For the other points, refer to the description of the first embodiment.

In the second embodiment, Formula (2) below is further considered in setting the target GBIR value input in step S110 given in FIG. 2.

$$\text{Target ESFQD value} = B_1 \times \text{target GBIR value} + B_2 \times \text{ESFQD value of wafer after polishing in previous batch} + B_3 \quad (2)$$

Specifically, the target GBIR value is selected within a predetermined range so that the target ESFQD value calculated by Formula (2) above is within a predetermined range. In step S110, the thus selected target GBIR value is input. Further, in this embodiment, in step S140, the ESFQD value of a wafer after polishing is measured in addition to the GBIR value. Here, in this embodiment, "ESFQD value of wafer after polishing in previous batch" in Formula (2) above refers to the ESFQD value measured by the measurement unit in step S140 of the immediately preceding batch. Note that the target ESFQD value can be basically set to be close to 0 nm, and for example, can be set to satisfy a range of target ESFQD value=0 nm±20 nm.

$B_1$, $B_2$, and $B_3$ in Formula (2) above are coefficients derived in advance as follows using actual values found in double-side polishing. The target GBIR value (for example, in a range of 200 nm or less that is a specification of wafers) and the target ESFQD value (for example, in a range of 0 nm±20 nm that is a wafer specification) are each determined in advance within a predetermined range, and double-side polishing of wafers is performed so as to meet the values. In each batch, the center thicknesses of the wafers before polishing, the GBIR values of the wafers after polishing, and the ESFQD values of the wafers after polishing are measured and these measured values are accumulated as actual values with the actual polishing times. Here, the GBIR value and the ESFQD value actually measured may be out of the range of the wafer specifications due to change in the wafer shape caused by the wear of the carrier plate and polishing pads, or change in the concentration of the polishing slurry caused by mixing of rinse water etc. Of the accumulated actual values, only the actual values corresponding to the GBIR values and the ESFQD values measured within the range of the wafer specifications are extracted. Next, using the extracted actual values, multiple regression analysis is performed using the target ESFQD value as an objective variable and using the target GBIR value and the ESFQD value after polishing in the previous batch as explanatory variables. Thus, $B_1$, $B_2$, and $B_3$ corresponding to the target GBIR value and the target ESFQD value determined in advance are derived. Note that consideration is given in performing this multiple regression analysis so that Formula (1) described above is also satisfied. This sequence of operations is repeated by changing the target GBIR value and the target ESFQD value within the predetermined range mentioned above, thus $B_1$, $B_2$, and $B_3$ corresponding to different target GBIR values and the target ESFQD values can be derived. For example, when the target GBIR value of a wafer is 200 nm or less and the target ESFQD value of the wafer is selected within a range of 0 nm±20 nm, $B_1$ is 0 to 500 (nm/nm), $B_2$ is 0.1 to 50 (nm/nm), and $B_3$ is −50 to 50 (nm). The thus derived $B_1$, $B_2$, and $B_3$ are stored in the storage unit 20. When the polishing time according to Formula (1) and Formula (2) above is calculated, $B_1$, $B_2$, and $B_3$ are read by the controller 16.

The term "ESFQD (Edge Site flatness Front reference least sQuare Deviation) value" herein means the ESFQD defined in SEMI M67, and is defined as the maximum deviation from the reference plane calculated by the least square method from the thickness data of each site obtained by equally dividing a ring-shaped region along the edge of a wafer in the circumferential direction. In other words, the ESFQD value is the SFQD value of each site (deviation from the reference plane in the region, which is the larger absolute value of the positive and negative deviations). Here, the sites are regions obtained by dividing the ring-shaped region defined in an area of 2 mm to 32 mm in the radial direction from the outermost periphery of the wafer into 72th in the circumferential direction.

According to the second embodiment, the feedback control of the polishing time is performed considering the ESFQD values in addition to the GBIR values, thus variation of the GBIR values and the ESFQD values of polished wafers between batches can be further reduced.

Third Embodiment

In the third embodiment, the ESFQR values are also considered in calculating the polishing time based on Formula (1) above in the first embodiment. This embodiment is the same as the second embodiment except that ESFQD is changed to ESFQR.

In the third embodiment, Formula (3) below is further considered in setting the target GBIR value input in step S110 given in FIG. 2.

$$\text{Target ESFQR value} = C_1 \times \text{target GBIR value} + C_2 \times \text{ESFQR value of wafer after polishing in previous batch} + C_3 \quad (3)$$

Specifically, the target GBIR value is selected within a predetermined range so that the target ESFQR value calculated by Formula (3) above is within a predetermined range. In step S110, the thus selected target GBIR value is input. Further, in this embodiment, in step S140, the ESFQR value of a wafer after polishing is measured in addition to the GBIR value. Here, in this embodiment, "ESFQR value of wafer after polishing in previous batch" in Formula (3) above refers to the ESFQR value measured by the measurement unit in step S140 of the immediately preceding batch.

$C_1$, $C_2$, and $C_3$ in Formula (3) above can be derived by the same method as $B_1$, $B_2$, and $B_3$ described with respect to the second embodiment except for changing ESFQD to ESFQR.

The term "ESFQR (Edge Site flatness Front least sQuares Range) value" herein means the ESFQR defined in SEMI M67.

According to the third embodiment, the feedback control of the polishing time is performed considering the ESFQR values in addition to the GBIR values, thus variation of the GBIR values and the ESFQR values of polished wafers between batches can be further reduced.

Fourth Embodiment

Members used in a double-side polishing apparatus, such as a carrier plate, polishing pads, and a polishing slurry are deteriorated as the number of batch processes increases; accordingly, those members are regularly replaced. The inventors found that in the batch immediately after those members are replaced, or a few batches after the replacement, the variation of the GBIR values between batches can be further reduced by using a polishing time taking into account the influence of member replacement by the following method instead of using a polishing time calculated by Formula (1) above. An example of a method of double-side polishing wafers in the fourth embodiment will now be described with reference to appropriate reference to FIG. 1 and FIGS. 3 to 6. Note that the double-side polishing apparatus in the fourth embodiment can use the double-side polishing apparatus 100 of the first embodiment, so the detailed description will not be repeated.

In this embodiment, the replacements of members will be described assuming that the carrier plate is a first member, the pair of polishing pads is a second member, and the polishing slurry is a third member (accordingly, the total number M of the replaced members is 3 in this embodiment).

Hereinafter, $n_1$ ($n_1$ is a natural number) is an index indicating that the current batch is the $n_1$ th batch after the replacement of the carrier plate. Further, $n_2$ ($n_2$ is a natural number) is an index indicating that the current batch is the $n_2$th batch after the replacement of the polishing pads. Further, $n_3$ ($n_3$ is a natural number) is an index indicating that the current batch is the $n_3$th batch after the replacement of the polishing slurry. Accordingly, in the batch immediately preceding the replacement of the carrier plate, $n_1=1$; in the batch immediately preceding the replacement of the polishing pads, $n_2=1$; and in the batch immediately preceding the replacement of the polishing slurry, $n_3=1$. Further, $n_1$, $n_2$, and $n_3$ count up by one each time a batch process is repeated. Here, $n_1$, $n_2$, and $n_3$ are stored in the storage unit 20.

Figure 3:
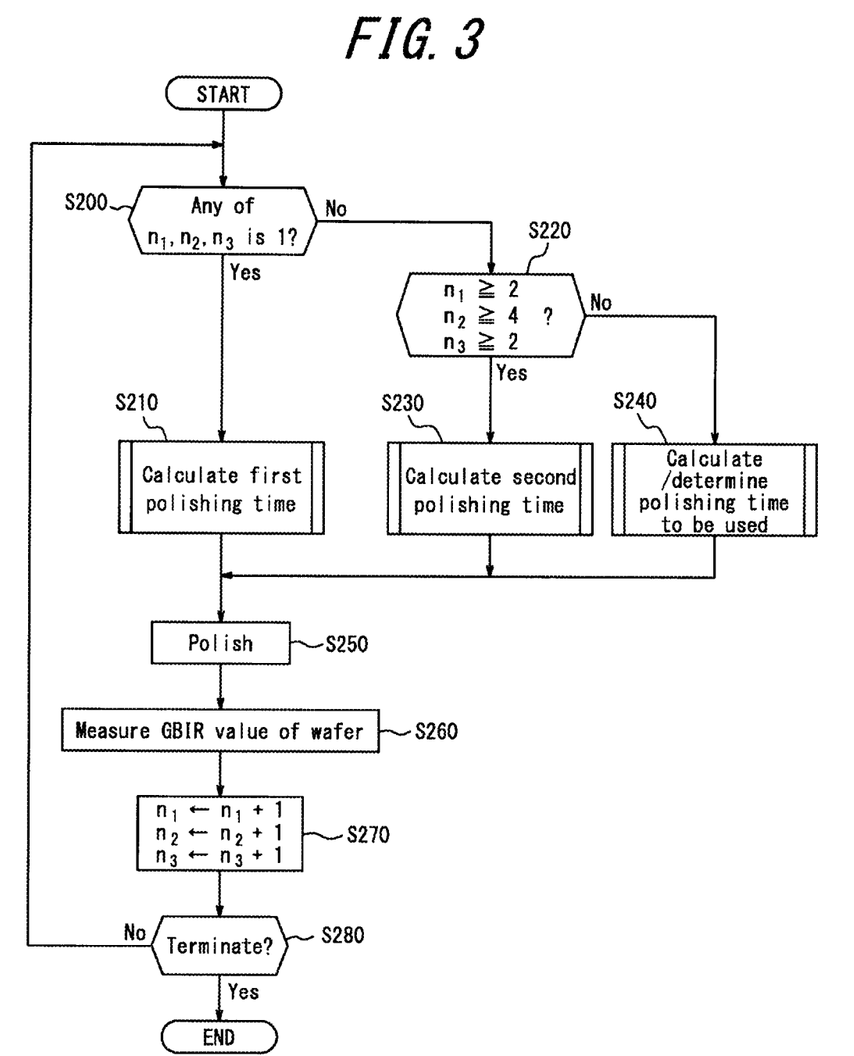
FIG. 3 is a flowchart illustrating a method of double-side polishing wafers according to the fourth embodiment of this disclosure.

Referring to FIGS. 1 and 3, when a batch process starts, the controller 16 determines whether any of $n_1=1$, $n_2=1$, and $n_3=1$ is satisfied (step S200). When any of $n_1=1$, $n_2=1$, and $n_3=1$ is satisfied, the process proceeds to step S210. Here, the procedure of step S210 in FIG. 3 is described with reference to FIG. 4.

Figure 4:
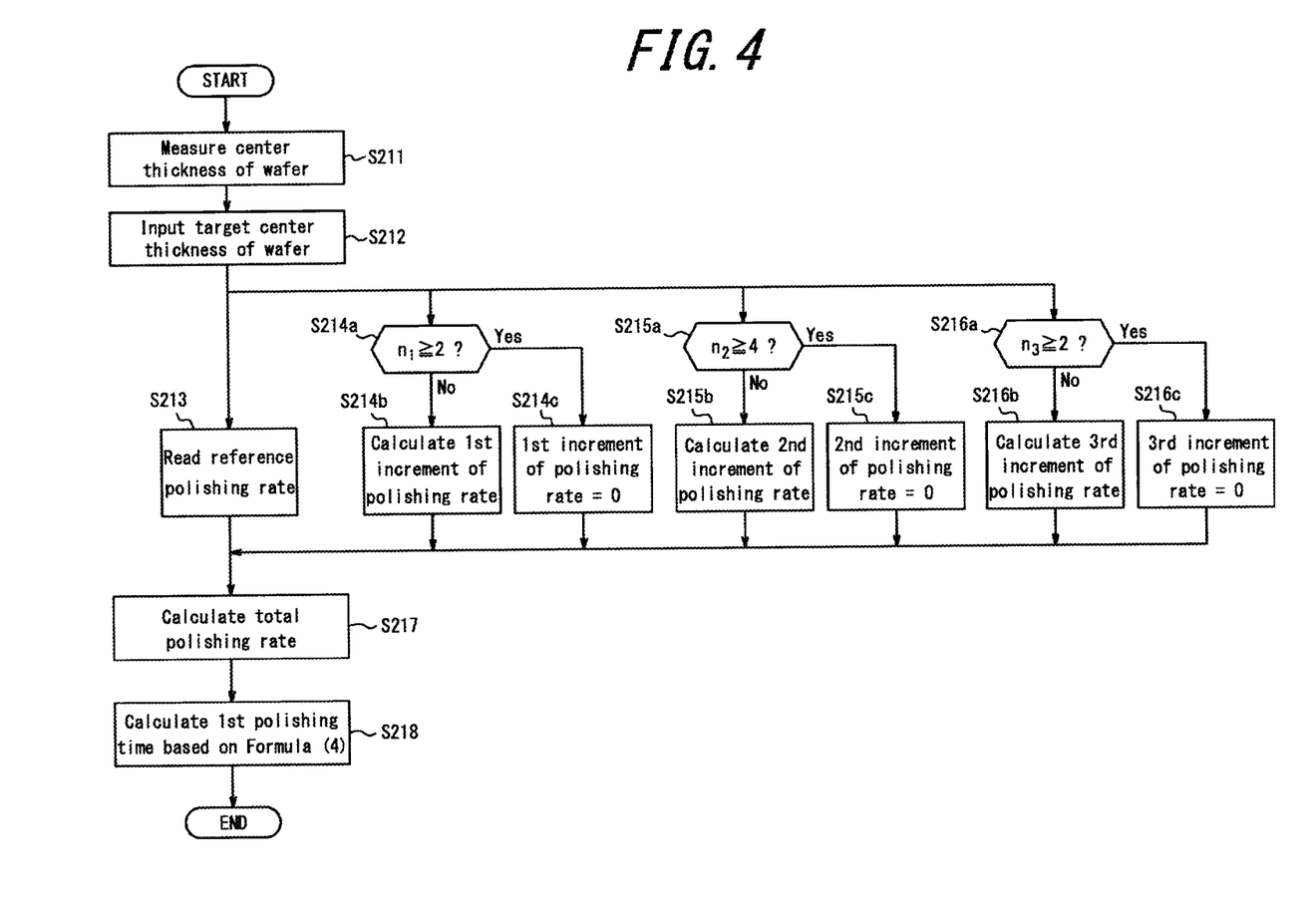
FIG. 4 is a flowchart illustrating the procedure of step S210 in FIG. 3.

Referring to FIG. 4, when the procedure of step S210 starts, the spectral interference displacement meter as the measurement unit 18 measures the center thickness of a wafer before polishing (step S211). The measured center thickness of the wafer before polishing is sent to the controller 16 and stored in the storage unit 20. For the details of the measurement method, refer to the description of step S100 in the first embodiment.

Next, a target center thickness of the wafer is input to the controller 16 via the input device (step S212). The target center thickness of the wafer can be set to be within a range of ±3 μm from the center thickness of the wafer specification. For example when the wafer has a diameter of 300 mm, the center thickness of the wafer specification can be set within a range of 750 μm or more and 830 μm or less.

Next, the controller 16 reads a reference polishing rate from the storage unit 20 (step S213). Here the "reference polishing rate" is the average of the actual values of the polishing rates in batches that are not affected by the replacements of the carrier plate, the polishing pads, and the polishing slurry, of the actual values of the polishing rates of the wafers having substantially the same center thickness before polishing and target center thickness as those of the wafers to be polished within a tolerance of ±3 μm. Note that the "batches that are not affected by the replacements of the carrier plate, the polishing pads, and the polishing slurry" are not limited as long as each of them is a certain batch that is one of the 5th to 100th batches after the replacement of the carrier plate, one of the 5th to 100th batches after the replacement of the polishing pads, and one of the 5th to 100th batches after the replacement of the polishing slurry. Further, the average is preferably determined using more than 20 actual values. Hereinafter, "wafers having substantially the same center thickness before polishing and target center thickness as those of the wafers to be polished within a tolerance of ±3 μm" are referred to as "wafers having the same shape as that of the wafers to be polished".

Concurrently with the calculation of the reference polishing rate, the controller 16 calculates a first increment of polishing rate, a second increment of polishing rate, and a third increment of polishing rate (steps S214a to S214c, steps S215a to S215c, and steps S216a to S216c). The first to third increments of polishing rate represent the degrees of influence of the replacement of the members on the reference polishing rate, and are determined by the following method. Here, the controller 16 determines whether $n_1 \geq k_1$ (step 214a), $n_2 \geq k_2$ (step 215a), and $n_3 \geq k_3$ (step 216a) are satisfied. In this embodiment, 2 is used as $k_1$, 4 as $k_2$, and 2 as $k_3$. However, $k_1$, $k_2$, and $k_3$ are not limited to those, and can be changed as appropriate within a range of, for example, $2 \leq k_1 \leq 5$, $2 \leq k_2 \leq 5$, and $2 \leq k_3 \leq 5$ depending on the kind of the carrier plate, the polishing pads, and the polishing slurry.

The controller 16 determines whether $n_1 \geq 2$ is satisfied or not (step S214a). When $n_1 < 2$ (that is, $n_1=1$), the first increment of polishing rate is the average of differences obtained by subtracting, of the actual values of the polishing rates of wafers having the same shape as that of the wafers to be polished, the actual values of the polishing rates in batches that are not affected by the replacement of the carrier plate, the polishing pads, and the polishing slurry from the actual values of the polishing rates in the $n_1$th batch after the replacement of the carrier plate, which batch is not affected by the replacements of the polishing pads and the polishing slurry (step S214b). Note that the "batch that is not affected by the replacements of the polishing pads and the polishing slurry" is not limited as long as it is a certain batch that is one of the 5th to 100th batches after the replacement of the polishing pads and one of the 5th to 100th batches after the replacement of the polishing slurry. Further, the average is preferably determined using more than 20 actual values. On the other hand, when $n_1 \geq 2$, the polishing rates are not affected by the replacement of the carrier plate, thus the controller 16 determines the first increment of polishing rate as 0 (step S214c).

Concurrently, the controller 16 determines whether $n_2 \geq 4$ is satisfied or not (step S215a). When $n_2 < 4$, the second increment of polishing rate is the average of differences obtained by subtracting, of the actual values of the polishing rates of wafers having the same shape as that of the wafers to be polished, the actual values of the polishing rates in batches that are not affected by the replacement of the carrier plate, the polishing pads, and the polishing slurry from the actual values of the polishing rates in the $n_2$th batch after the replacement of the polishing pads, which batch is not affected by the replacements of the carrier plate and the polishing slurry (step S215b). Note that the "batch that is not affected by the replacements of the carrier plate and the polishing slurry" is not limited as long as it is a certain batch that is one of the 5th to 100th batches after the replacement of the carrier plate and one of the 5th to 100th batches after the replacement of the polishing slurry. Further, the average is preferably determined using more than 20 actual values. On the other hand, when $n_2 \geq 4$, the polishing rates are not affected by the replacement of the polishing pads, thus the controller 16 determines the second increment of polishing rate as 0 (step S215c).

Concurrently, the controller 16 determines whether $n_3 \geq 2$ is satisfied or not (step S216a). When $n_3 < 2$ (that is, $n_3 = 1$), the third increment of polishing rate is the average of differences obtained by subtracting, of the actual values of the polishing rates of wafers having the same shape as that of the wafers to be polished, the actual values of the polishing rates in batches that are not affected by the replacement of the carrier plate, the polishing pads, and the polishing slurry from the actual values of the polishing rates in the $n_3$th batch after the replacement of the polishing slurry, which batch is not affected by the replacements of the carrier plate and the polishing pads (step S216b). Note that the "batch that is not affected by the replacements of the carrier plate and the polishing pads" is not limited as long as it is a certain batch that is one of the 5th to 100th batches after the replacement of the carrier plate and one of the 5th to 100th batches after the replacement of the polishing pads. Further, the average is preferably determined using more than 20 actual values. On the other hand, when $n_3 \geq 2$, the polishing rates are not affected by the replacement of the polishing slurry, thus the controller 16 determines the third increment of polishing rate as 0 (step S216c).

Next, the controller 16 calculates the total polishing rate by adding the first increment of polishing rate, the second increment of polishing rate, and the third increment of polishing rate to the reference polishing rate (step S217).

Next, the controller 16 calculates the polishing time of the current batch based on Formula (4) below (step S218). In this specification, the polishing time calculated by this method is referred to as "first polishing time".

$$\text{First polishing time} = (\text{center thickness of wafer before polishing in current batch} - \text{target center thickness of wafer})/\text{total polishing rate} \quad (4)$$

The thus calculated first polishing time is a value obtained in consideration of the influence of member replacement on the polishing time using the polishing rates. Thus, the procedure of step S210 in FIG. 3 ends.

On the other hand, referring to FIG. 3, when the controller 16 determines that none of $n_1 = 1$, $n_2 = 1$, and $n_3 = 1$ is satisfied (that is, when all $n_1$, $n_2$, and $n_3$ are 2 or more) in step S200, the process proceeds to step S220. Further, the controller 16 determines whether all $n_1 \geq 2$, $n_2 \geq 4$, and $n_3 \geq 2$ are satisfied or not (step S220). When all $n_1 \geq 2$, $n_2 \geq 4$, and $n_3 \geq 2$ are satisfied, the process proceeds to step S230. Here, the procedure of step S230 in FIG. 3 is described with reference to FIG. 5.

When all $n_1 \geq 2$, $n_2 \geq 4$, and $n_3 \geq 2$ are satisfied, the polishing time is considered not to be affected by member replacement. Accordingly, in this case, the polishing time is calculated by the same method as the method of calculating the polishing time without considering member replacement in the first embodiment. Specifically, referring to FIG. 5, when the procedure of step S230 starts, the spectral interference displacement meter as the measurement unit 18 measures the center thickness of a wafer before polishing (step S231). For the details of the measurement method, refer to the description of step S100 in the first embodiment.

Figure 5:
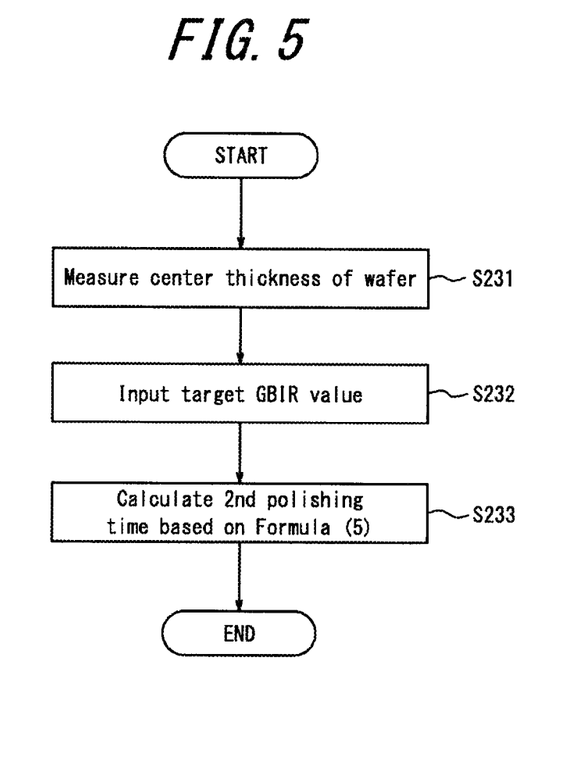
FIG. 5 is a flowchart illustrating the procedure of step S230 in FIG. 3.

Next, a target GBIR value of the wafer is input to the controller 16 via the input device (step S232). Here, the target GBIR value is a value that can be set as appropriate depending on the wafer specifications, and can be set as appropriate within a range of for example 200 nm or less.

Next, the controller 16 calculates the polishing time of the current batch based on Formula (5) below (step S233). In this specification, the polishing time calculated by this method is referred to as "second polishing time".

$$\text{Second polishing time} = \text{polishing time of previous batch} + A_1 \times (\text{center thickness of wafer before polishing in previous batch} - \text{center thickness of wafer before polishing in current batch}) + A_2 \times (\text{GBIR value of wafer after polishing in previous batch} - \text{target GBIR value}) + A_3 \quad (5)$$

Formula (5) above corresponds to Formula (1) in the first embodiment, and $A_1$, $A_2$, and $A_3$ are set as described above; thus, for the details, refer to the description of the first embodiment. Thus, the procedure of step S230 in FIG. 3 ends.

On the other hand, referring to FIG. 3, when any of $n_1 \geq 2$, $n_2 \geq 4$, and $n_3 \geq 2$ is not satisfied in step S220, the process proceeds to step S240. Here, the procedure of step S240 in FIG. 3 is described with reference to FIG. 6.

Even when any of $n_1 \geq 2$, $n_2 \geq 4$, and $n_3 \geq 2$ is not satisfied, there are some cases where the second polishing time is appropriately used instead of the first polishing time. Step S240 is a procedure designed mainly to determine whether using the second polishing time is appropriate or not. Specifically, referring to FIG. 6, when the procedure of step S240 starts, the controller 16 calculates the first polishing time (step S241) in accordance with the flowchart in FIG. 4, and the first determination amount is then calculated based on Formula (6) below (step S242). Concurrently, the controller 16 calculates the second polishing time in accordance with the flowchart in FIG. 5 (step S243), and a second determination amount is then calculated based on Formula (7) below (step S244).

Figure 6:
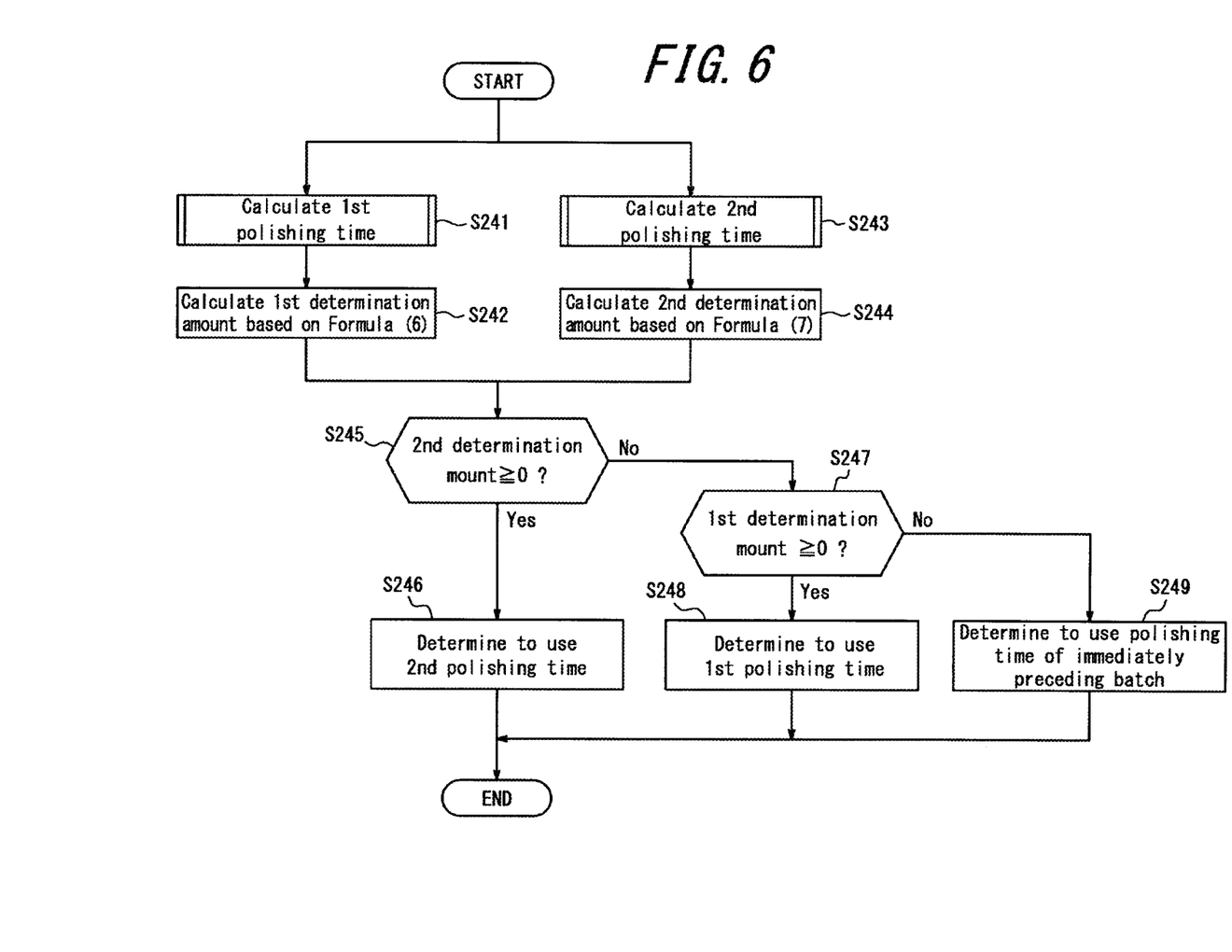
FIG. 6 is a flowchart illustrating the procedure of step S240 in FIG. 3.

First determination amount=(target GBIR value−
GBIR value of wafer after polishing in previous
batch)×(first polishing time−polishing time of
previous batch)   (6)

Second determination amount=(target GBIR value−
GBIR value of wafer after polishing in previous
batch)×(second polishing time−polishing time
of previous batch)   (7)

For the calculation of the first polishing time (step S241), refer to the description of steps S211 to S218 described in detail with reference to FIG. 4. However, in step S241, in addition to the target center thickness of the wafer in step S212 in FIG. 4, the target GBIR value used in Formula (7) above is input. For the calculation of the second polishing time (step S242), refer to the description of steps S231 to S233 described in detail with reference to FIG. 5.

In steps S245 to S249 to be described later, the polishing time of the current batch is determined based on the first determination amount and the second determination amount. Here, with respect to the first determination amount and the second determination amount, the sign is important. As described below, when the first determination amount<0, it is not appropriate to use the first polishing time, whereas when the second determination amount<0, it is not appropriate to use the second polishing time.

In the case where the first determination amount<0, (i) (target GBIR value−GBIR value of wafer after polishing in previous batch)>0 and (first polishing time−polishing time of previous batch)<0, or (ii) (target GBIR value−GBIR value of wafer after polishing in previous batch)<0 and (first polishing time−polishing time of previous batch)>0. In the case of (i), since the target GBIR value of the current batch is larger than the GBIR value of the previous batch, the polishing time must be set to be longer than that in the previous batch by right. Nevertheless, the actually calculated first polishing time is shorter than the polishing time in the previous batch. This suggests that in this case, it is not appropriate to use the first polishing time. In the case of (ii), since the target GBIR value of the current batch is smaller than the GBIR value of the previous hatch, the polishing time must be set to be shorter than that in the previous batch by right. Nevertheless, the actually calculated first polishing time is longer than the polishing time in the previous batch. This suggests that also in this case, it is not appropriate to use the first polishing time. These conditions for the first determination amount apply to the second determination mount. Note that when the second polishing time≥0, irrespective of whether the first polishing time is positive or negative, the second polishing time is always used as the polishing time. This is because the use of the second polishing time improves the polishing accuracy as compared with the use of the first polishing time taking the polishing rate into account, since the GBIR value is also considered in addition to the center thickness of the wafer.

This being the case, in steps S245 to S249, the polishing time of the current batch is set as follows. The controller 16 determines whether the second determination amount≥0 is satisfied or not (step S245). When the second determination amount≥0, the controller 16 determines to use the second polishing time as the polishing time of the current batch (step S246), and this ends the procedure of step S240 in FIG. 3. On the other hand, when the second determination amount<0, the controller 16 further determines whether the first determination amount≥0 is satisfied or not (step S247). When the first determination amount≥0, the controller 16 determines to use the first polishing time as the polishing time of the current batch (step S248). Thus, the procedure of step S240 in FIG. 3 ends. When the second determination amount<0 and the first determination amount<0, the controller 16 determines to use the polishing time of the immediately preceding batch as the polishing time of the current batch (step S249). Thus, the procedure of step S240 in FIG. 3 ends.

Next, referring to FIGS. 1 and 3, when the polishing time of the current batch is determined in this manner, double-side polishing of wafers for the polishing time is started by rotating the upper plate 2, the lower plate 4, the sun gear 8, and internal gear 10 by the controller 16 (step S250). For the details of the double-side polishing method, refer to the description of step S130 in the first embodiment.

Next, upon receiving the information of the end of double-side polishing from the controller 16, the spectral interference displacement meter as the measurement unit 18 measures the GBIR value of the wafer after polishing (step S260). For the details of the measurement method, refer to the description of step S140 in the first embodiment. The measured GBIR value is stored in the storage unit 20 to be used for the calculation of the polishing time of the current batch in the next batch.

Next, the controller 16 counts up $n_1$, $n_2$, and $n_3$ stored in the storage unit 20 by one (step S270). Next, the controller 16 determines whether the batch process is terminated or not (step S280). When the batch process is not terminated, double-side polishing of the next batch starts again from step S200. On the other hand, when the batch process is terminated, the batch process ends here.

According to the fourth embodiment, feedback control of the polishing time is performed considering the influence of member replacement on the polishing time as well, thereby further reducing variation of the GBIR values of the polished wafers between batches.

Note that the number of members to be replaced is not limited to 3, and may be for example 2 selected from the carrier plate, the polishing pads, and the polishing slurry. Further, in calculating the second polishing time, Formula (2) and Formula (3) described with respect to the second and third embodiments may be considered in addition to Formula (5). For the details, refer to the description in the second and third embodiments.

Fifth Embodiment

In the fourth embodiment, the members to be replaced are the carrier plate, the polishing pads, and the polishing slurry, whereas the replacement of only one of those members is considered in the fifth embodiment. The fifth embodiment can be performed in the same manner as the fourth embodiment except that the following changes are made in step S200 and step S220 in FIG. 3 and steps S213 to S217 in FIG. 4. Thus, only the differences from the fourth embodiment will be described below.

The current batch is the nth batch after the replacement of the member (where n is a natural number). Referring to FIG. 3, in step S200, whether n=1 or not is determined; in step S220, n≥k (k is a natural number equal to or more than 2 determined depending on the member to be replaced). Here, k is a natural number equal to or more than 2 determined depending on the member to be replaced, and can be set within a range of for example 2≤k≤5. Further, referring to FIG. 4, steps S213 to S217 in the fourth embodiment are replaced with the following procedure.

Specifically, the total polishing rate in the fourth embodiment is replaced with the average of the actual values of the polishing rates in the nth batch after the replacement of the member in the fifth embodiment. Note that the average is preferably determined using more than 20 actual values (wafers).

For the other aspects, refer to the description of Embodiment 4.

According to the fifth embodiment, feedback control of the polishing time is performed considering the influence of member replacement on the polishing time as well, thereby further reducing variation of the GBIR values of the polished wafers between batches.

Methods of double-side polishing wafers according to this disclosure have been described using the first to fifth embodiments as examples; however, this disclosure is not limited to the above embodiments, and modifications may be made as appropriate without departing from the scope defined by the claims.

For example, members used in a double-side polishing apparatus are actually deteriorated over time, and the deterioration has an influence on polishing time. Also for the polishing time in the first to third embodiments and the second polishing time in the fourth and fifth embodiments, the influence is indirectly considered by using the coefficients in Formula (1) to Formula (3) or Formula (5) that are derived from the actual values found in actual polishing. However, in calculating the polishing time (or the second polishing time), the polishing time resulting in the target shape of wafers can be more accurately calculated by directly considering the deterioration of the members over time. For example, Formula (1)' below can be used instead of Formula (1) by using a parameter representing the deterioration of a member over time as "integrated polishing time after member replacement".

> Polishing time of current batch=polishing time of previous batch+$D_1$×(center thickness of wafer before polishing in previous batch−center thickness of wafer before polishing in current batch)+$D_2$×(GBIR value of wafer after polishing in previous batch−target GBIR value)+$D_3$× integrated polishing time after member replacement+$D_4$ (1)', where $D_1$ to $D_4$ are coefficients calculated by performing multiple regression analysis on the actual values as in the first embodiment.

Alternatively, when the integrated polishing time after member replacement and the original thickness difference (=center thickness of wafer before polishing in previous batch−center thickness of wafer before polishing in current batch) have an interaction, Formula (1)" below may be used instead of Formula (1) above.

> Polishing time of current batch=polishing time of previous batch+$E_1$×(center thickness of wafer before polishing in previous batch−center thickness of wafer before polishing in current batch)+$E_2$×(GBIR value of wafer after polishing in previous batch−target GBIR value)+$E_3$×integrated polishing time after member replacement+$E_4$×(center thickness of wafer before polishing in previous batch−center thickness of wafer before polishing in current batch)×(integrated polishing time after member replacement)+$E_5$ (1)", where $E_1$ to $E_5$ are coefficients calculated by performing multiple regression analysis on the actual values as in the first embodiment.

EXAMPLES

Example

In order to ascertain advantageous effects of this disclosure, double-side polishing was performed on wafers by batch processing using the double-side polishing apparatus depicted in FIG. 1 and the double-side polishing method illustrated in FIG. 2, and the GBIR values and the ESFQD values of the polished wafers were evaluated in Example.

The following conditions were used in the evaluation. In Formula (1), $A_1$ was 60 s/μm, $A_2$ was −1 s/nm, $A_3$ was 20 s, and the target GBIR value was 200 nm. Further, the polishing pads were urethane foam polishing pads, and the polishing slurry was an alkaline polishing slurry containing silica abrasive grains. As the sun gear and the internal gear were rotated, the carrier plate was rotated by the mesh of the gears, and was rotated about the sun gear on the center of the upper and lower plates as the center axis. At the same time, the upper plate was also rotated, and the lower plate was rotated in the opposite direction to that of the upper plate. The rotation speeds of the upper and lower plates were 30 rpm each. The wafers were silicon wafers having a diameter of 300 mm.

Comparative Example

In Comparative Example, the same evaluation was performed using a conventional double-side polishing apparatus without a controller, a measurement unit, and a storage unit functioning as those in Example. Specifically, in Comparative Example, double-side polishing was performed at a polishing rate of 0.5 μm/min for a polishing time set depending on the measured thickness without performing feedback control on the polishing time unlike in Example.

Evaluation Method and Description of Evaluation Results

Figure 7A:
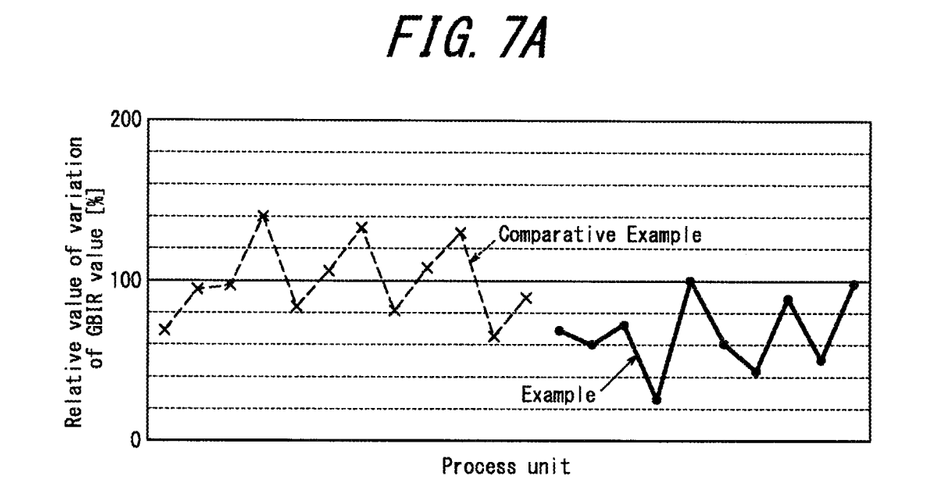
FIG. 7A is a graph illustrating the relative value of the variations of the GBIR values of wafers after polishing of each process unit in Example and Comparative Example.
Figure 7B:
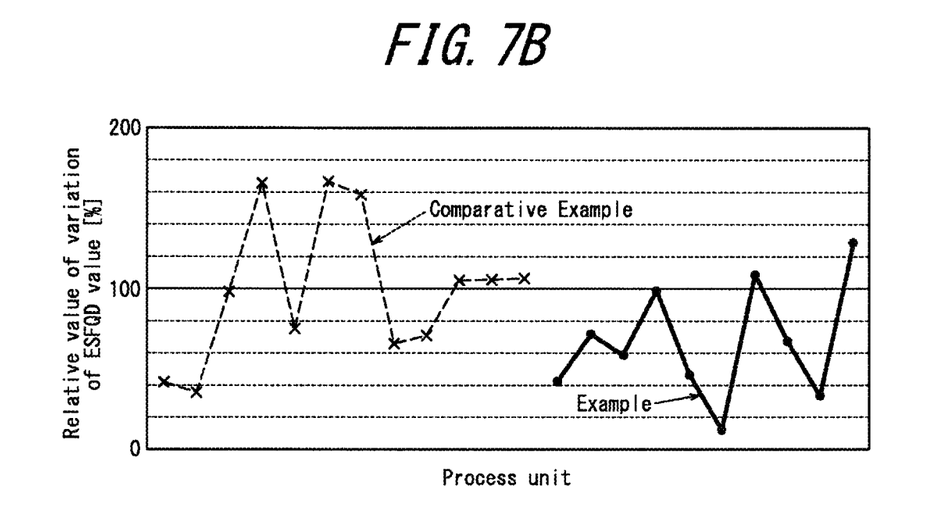
FIG. 7B is a graph illustrating the relative value of the variations of the ESFQD values of wafers after polishing of each process unit in Example and Comparative Example.

In Example and Comparative Example, the GBIR values and the ESFQD values of the wafers polished in each batch were measured using a flatness measurement system (WaferSight). The measurement results are given in FIGS. 7A and 7B. Note that "relative value of the variations of the GBIR values" mentioned in FIG. 7A is obtained by dividing "the average of the variations of the GBIR values of each process unit in Example" by "the average of the variations of the GBIR values throughout all process units in Comparative Example" in Example, and is obtained by dividing "the average of the variations of the GBIR values of each process unit in Comparative Example" by "the average of the variations of the GBIR values throughout all process units in Comparative Example" in Comparative Example. Further, "relative value of the variations of the ESFQD values" mentioned in FIG. 7B is obtained by dividing "the average of the variations of the ESFQD values of each process unit in Example" by "the average of the variations of the ESFQD values of throughout all process units in Comparative Example" in Example, and is obtained by dividing "the average of the variations of the ESFQD values of each process unit in Comparative Example" by "the average of the variations of the ESFQD values of throughout all process units in Comparative Example" in Comparative Example. Here, each process unit means batch processing of 10 batches.

As evident from FIG. 7A, the variation of the GBIR values was reduced in Example in which feedback control was performed on the polishing time as compared with Comparative Example. Further, surprisingly, in Example, the variation of the ESFQD values was reduced even though feedback control was not performed on the ESFQD values as compared with Comparative Example as illustrated in FIG. 7B.

INDUSTRIAL APPLICABILITY

According to the disclosed method of double-side polishing a wafer, variation of the GBIR values of polished wafers between batches can be reduced.

REFERENCE SIGNS LIST

100: Double-side polishing apparatus
2: Upper plate
4: Lower plate
6: Rotating platens
8: Sun gear
10: Internal gear
12: Carrier plate
14: Slurry supply system
16: Controller
18: Measurement unit
20: Storage unit

The invention claimed is:

1. A method of double-side polishing a wafer using a batch processing double-side polishing apparatus for wafer, including
rotating platens having an upper plate and a lower plate;
a sun gear provided at a center portion of the rotating platens;
an internal gear provided on a peripheral portion of the rotating platens; and
a carrier plate having one or more retainer openings that is provided between the upper plate and the lower plate,
in which apparatus a polishing pad is attached to each of an undersurface of the upper plate and a top surface of the lower plate,
wherein a current batch comprises:
measuring a center thickness of the wafer before polishing;
setting a target GBIR value within a predetermined range that is a specification of the wafer;
calculating a polishing time of the current batch based on Formula (1) below; and
while supplying a polishing slurry to the polishing pad, relatively rotating the rotating platens and the carrier plate so that both surfaces of the wafer are polished for the calculated polishing time of the current batch,
wherein after polishing in a previous batch, a GBIR value of a wafer has been measured in accordance with SEMI M1 and SEMI MF1530, $$\text{Polishing time of current batch} = \text{polishing time of previous batch} + A_1 \times (\text{center thickness of wafer before polishing in previous batch} - \text{center thickness of wafer before polishing in current batch}) + A_2 \times (\text{GBIR value of wafer after polishing in previous batch} - \text{target GBIR value}) + A_3 \quad (1),$$

where $A_1$, $A_2$, and $A_3$ are predetermined coefficients.

2. The method of double-side polishing a wafer according to claim 1, wherein in the current batch, the target GBIR value is set within a predetermined range so that a target ESFQD value calculated by Formula (2) below is within a predetermined range that is a specification of the wafer,
wherein after polishing in a previous batch, a ESFQD value of a wafer has been measured in accordance with SEMI M67, $$\text{Target ESFQD value} = B_1 \times \text{target GBIR value} + B_2 \times \text{ESFQD value after polishing in previous batch} + B_3 \quad (2),$$

where $B_1$, $B_2$, and $B_3$ are predetermined coefficients.

3. The method of double-side polishing a wafer according to claim 1, wherein in the current batch, the target GBIR value is set within a predetermined range so that a target ESFQR value calculated by Formula (3) below is within a predetermined range that is a specification of the wafer,
wherein after polishing in a previous batch, a ESFQR value of a wafer has been measured in accordance with SEMI M67, $$\text{Target ESFQR value} = C_1 \times \text{target GBIR value} + C_2 \times \text{ESFQR value after polishing in previous batch} + C_3 \quad (3),$$

where $C_1$, $C_2$, and $C_3$ are predetermined coefficients.

* * * * *